United States Patent [19]
Legates

[11] Patent Number: 5,969,574
[45] Date of Patent: Oct. 19, 1999

[54] LOW VOLTAGE CURRENT SENSE AMPLIFIER

[75] Inventor: Bryan A. Legates, Sunnyvale, Calif.

[73] Assignee: Analog Devices, Inc., Norwood, Mass.

[21] Appl. No.: 09/090,711

[22] Filed: Jun. 4, 1998

[51] Int. Cl.$^6$ .................................................. H03F 3/04
[52] U.S. Cl. ........................................... 330/288; 330/290
[58] Field of Search .................................. 330/288, 290; 323/315, 316

[56] References Cited

U.S. PATENT DOCUMENTS

| | | | |
|---|---|---|---|
| 2,863,957 | 12/1958 | Hamilton | 179/171 |
| 5,307,027 | 4/1994 | Grasset | 330/288 |
| 5,451,908 | 9/1995 | Bohme | 330/300 |
| 5,627,494 | 5/1997 | Somerville et al. | 330/257 |

Primary Examiner—Robert Pascal
Assistant Examiner—Henry Choe
Attorney, Agent, or Firm—Koppel & Jacobs

[57] ABSTRACT

An accurate, low voltage, low parts-count current sense amplifier can be employed to sense either high side or low side currents. A pair of transistors are connected in a common-base configuration and biased with equal currents, with a sense resistor connected between their respective emitter circuits. A sensed current develops a voltage across the sense resistor which unbalances the transistor currents. A third transistor is connected to provide a feedback current to detect and correct the current imbalance; the feedback current is directly proportional to the sensed current, and serves as the current sense amplifier's output. The current sense amplifier requires only three transistors, can be realized with bipolar or FET devices of either polarity, and can operate at supply voltages as low as about 1.1 volts.

16 Claims, 5 Drawing Sheets

LOW VOLTAGE CURRENT SENSE AMPLIFIER

BACKGROUND OF THE INVENTION

1. Field of the Invention

This invention relates to the field of current sense amplifiers, particularly those designed to operate with a low supply voltage.

2. Description of the Related Art

Current sense amplifiers produce an output that varies with a particular current of interest. Such amplifiers are typically connected across a "sense resistor" through which the current of interest, i.e., the "sensed current", flows. The amplifiers produce a current or voltage output that is proportional to the sensed current.

Figure 1:
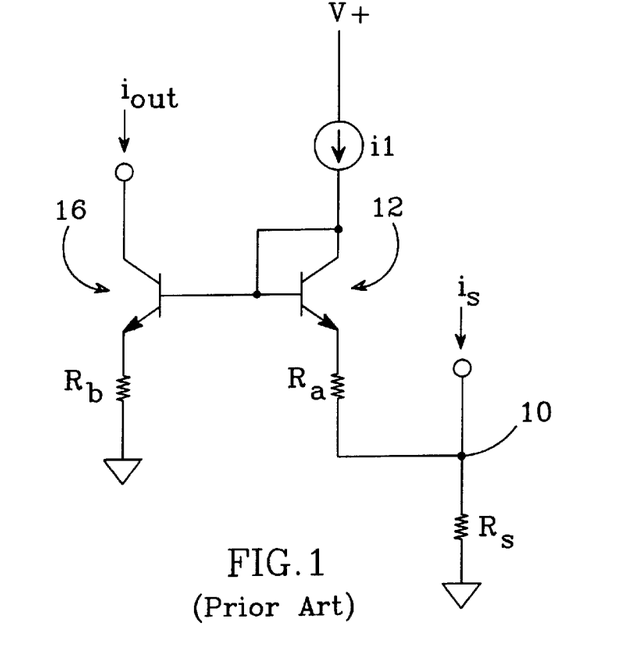
FIG. 1 is a schematic diagram of a prior art current sense amplifier.

A known current sense amplifier is shown in FIG. 1. A sense resistor $R_s$ is connected to carry the current of interest $i_s$, creating a voltage at a node 10 that increases with the sensed current. A diode-connected transistor 12, shown here as an npn bipolar transistor though pnp's and field-effect transistors (FETs) are used as well, is biased with a current source i1 and is connected to node 10 via a resistor $R_a$. A second transistor 16 shares a common base connection with transistor 12, and its emitter is connected to ground through a resistor $R_b$. The current sense amplifier output $i_{out}$ is taken at the collector of transistor 16.

An increasing $i_s$ increases the voltage at node 10, as well as at the emitter of transistor 12. This raises the voltage at the bases of transistors 12 and 16, boosting the drive to transistor 16 and thereby increasing $i_{out}$. For this circuit, output $i_{out}$ is related to the sensed current $i_s$ as follows:

$$i_{out}=i_s(R_s/R_a)+i1(R_b/R_a)-(V_T\ln(i_{out}/i1))/R_a$$

Unfortunately, the output current produced by this current sense amplifier it is not very accurate. The output current equation's "i1 $(R_b/R_a)$" and "$(V_T\ln(i_{out}/i1))/R_a$" terms are error terms, which show that the $i_{out}$ is greatly affected by changes in current source i1 and by changes in temperature.

Another current sense amplifier is disclosed in U.S. Pat. No. 5,627,494 to Somerville. This amplifier is referred to as a "high side" amplifier, because it is arranged to sense a current that is near the supply voltage, as opposed to a "low side" amplifier which senses a current near ground. Though more accurate than the amplifier of FIG. 1, this circuit (as shown in FIG. 3 of the patent) requires seven transistors, two diodes, five resistors and a current source. The circuit has two transistors (43, 44) in its output stage and another (35 or 36) in its input stage, and as such requires a supply voltage equal to at least $V_{out}+2(V_{be})+V_{sat}+V_{R1}+V_{SENSE}$ to operate. Using typical values, a supply voltage of at least 2 volts is needed to operate this circuit, or more if $V_{OUT}$ is larger.

Present trends in analog circuit design are toward ever lower supply voltages. A need exists for a current sense amplifier that is capable of operating with a low supply voltage while producing an accurate output current.

SUMMARY OF THE INVENTION

A current sense amplifier is presented that overcomes the drawbacks of the prior art circuits discussed above. The amplifier operates with a supply voltage as low at 1.1 volts, can be employed to sense either high side or low side current, requires very few components, yet provides a high degree of accuracy.

A pair of transistors are connected in a common-base configuration and are biased with currents from a pair of current sources. Each transistor has a resistor in series with its emitter, and a sense resistor is connected between the opposite ends of the two emitter resistors. A current to be sensed is routed through the sense resistor.

The transistors are preferably well-matched, and the current sources and resistors are preferably equal, so that with no current in the sense resistor, the currents through the two transistors are about equal. A non-zero sensed current, however, causes a voltage to appear across the sense resistor which causes the transistor currents to become unbalanced.

A third transistor is connected to provide negative feedback to the pair transistors—detecting and correcting a current imbalance. The third transistor's control input is connected between the collector of one of the pair transistors and the emitter of the other pair transistor; when a current imbalance occurs, the third transistor generates a feedback current that rebalances the two pair transistor currents. This feedback current is directly proportional to the sensed current, and serves as the amplifier's output.

The feedback current and the sensed current are related by a simple expression with no significant error terms. The ratio of sensed current to feedback current is established by the resistances of the sense resistor and the pair of resistors, enabling the current sense amplifier to, for example, sense a current of several amps while outputting a current of several microamps.

The current sense amplifier requires only three transistors, three resistors, and two current sources, and can be realized with bipolar or FET devices of either polarity. With only one full junction drop between the sensed current and the supply voltage, the current sense amplifier can be operated with supply voltages as low as about 1.1 volts, and can be configured to sense either a low side or a high side current. The accuracy, low supply voltage requirement and low parts count of the current sense amplifier find widespread applicability; for example, sensing switching current in current mode switching regulators.

Further features and advantages of the invention will be apparent to those skilled in the art from the following detailed description, taken together with the accompanying drawings.

DETAILED DESCRIPTION OF THE INVENTION

Figure 2A:
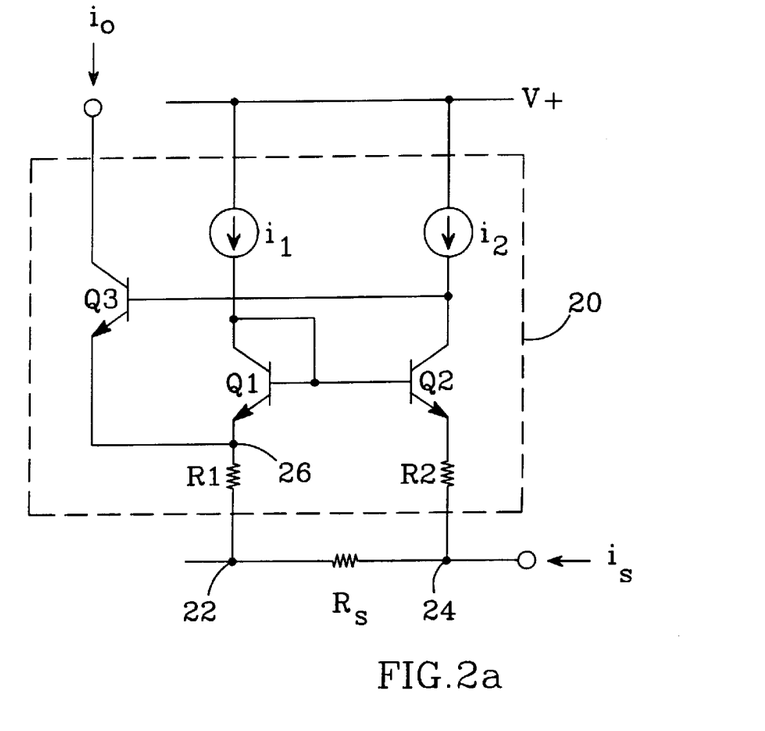
FIG. 2a is a schematic diagram of a bipolar implementation of a low side current sense amplifier per the present invention.

An embodiment of an accurate, low voltage, low parts-count current sense amplifier 20 per the present invention is shown in FIG. 2a. A pair of bipolar transistors Q1 and Q2 are connected in a common-base configuration. The collector of each transistor is connected to a respective current source $i_1$ and $i_2$. Transistor Q1 is diode-connected. A pair of resistors R1 and R2 are connected between Q1's and Q2's respective emitters and a first node 22 and a second node 24, respectively. A sense resistor $R_s$ is connected between the first and second nodes. In use, sense resistor $R_s$ is inserted into a circuit in series with a current of interest, so that the current of interest flows through the sense resistor. Current through the sense resistor is referred to herein as the "sensed current", $i_s$.

The circuit shown in FIG. 2a is arranged as a low side current sense amplifier. As typically configured, transistors Q1 and Q2 are well-matched, current sources $i_1$ and $i_2$ supply approximately equal currents, R1 and R2 have approximately equal resistance values, and node 22 is grounded. When $i_s$ is equal to zero, the voltages at nodes 22 and 24 are equal, making the voltages at Q1's and Q2's respective emitters equal. Since their respective base voltages are also equal (due to the common-base connection), the base-emitter voltages of Q1 ($V_{be1}$) and Q2 ($V_{be2}$) are approximately equal, making their respective collector currents and collector voltages approximately equal as well (neglecting base currents).

When a current $i_s$ flows in $R_s$, a voltage equal to $i_s \times R_s$ appears across $R_s$, which raises the voltage of node 24 with respect to node 22 (assuming a positive direction of current flow from node 24 to node 22). This voltage causes a corresponding increase in Q2's emitter voltage, which decreases $V_{be2}$ and reduces Q2's collector current. That is, $V_{be1}$ and $V_{be2}$ no longer equal, their respective collector currents become unbalanced.

A third bipolar transistor Q3 is used to detect the current imbalance, with Q3's base connected to Q2's collector and Q3's emitter connected to a node 26 between Q1's emitter and resistor R1. When node 24 increases due to a positive sensed current $i_s$, Q2's collector current decreases with respect to Q1's, causing Q2's collector voltage to increase. This increase drives the base of Q3, which responds by providing a current to node 26, causing Q1's emitter voltage to increase. The current which Q3 provides to node 26 will increase until it is sufficient to make Q1's emitter voltage equal to Q2's emitter voltage, at which point the circuit becomes balanced again. Q3, then, provides a negative feedback function by providing current to node 26. This feedback current is the current sense amplifier's output current $i_o$, which is taken at the collector of Q3.

The relationship between output current $i_o$ and sensed current $i_s$ is determined as follows. With a current $i_o$ flowing in R1 and the emitter voltages of Q1 and Q2 equal, the voltages on the left and right side of the common-base connection are given by:

$$(i_1+i_o)R1+V_{be1}=V_{be2}+i_2R2+(i_2+i_s)R_s \tag{1}$$

$V_{be1}$ and $V_{be2}$ are given by $V_T \ln(i_1/I_s)$ and $V_T \ln(i_2/I_s)$, respectively, where $V_T = kT/q$ and $I_s$ is the junction saturation current. Substituting these values into (1):

$$i_1 R1+i_o R1+V_T \ln(i_1/I_s)=V_T \ln(i_2/I_s)+i_2(R2+R_s)+i_s R_s \tag{2}$$

Typically, $R_2 \gg R_s$, so that $i_2(R2+R_s) \approx i_2 R2$. When $i_1=i_2$, R1=R2, and Q1 and Q2 are well-matched, equation (2) reduces to $i_o R1 \approx i_1 R_s$, so that the output current $i_o$ is approximately given by:

$$i_o \approx i_s(R_s/R1) \tag{3}$$

Thus, the output current is related to the sensed current by a simple proportion, with no significant error terms to take into account. By appropriately sizing $R_s$ and R1, the current sense amplifier can sense a large current and generate an accurate, proportionate output current that is much smaller in magnitude.

FIG. 2a's low-side amplifier is shown implemented with n-type transistors, with its current sources $i_1$ and $i_2$ derived from a supply voltage V+ that is more positive than the sensed current. A low-side current sense amplifier per the present invention can be similarly implemented with p-type transistors, as long as a supply voltage sufficiently more negative than the sensed current is available.

The present invention improves over prior art designs by providing an output current that is an accurate representation of a sensed current with only three transistors, three resistors and two current sources. Another significant advantage is found in the fact that the current sense amplifier operates with a low supply voltage—down to about 1.1 volts. Assuming that current sources $i_1$ and $i_2$ are implemented with a single pnp transistor (as described below), the minimum supply voltage V+(min.) for the circuit of FIG. 2a is given by:

$$V+(\text{min.})=i_s R_s+V_{R2}+V_{be2}+V_{sat(pnp)} \tag{4}$$

Typical circuit values at a worst case temperature of $-50°$ C. are as follows:

Current sources $i_1$ and $i_2=10\ \mu A$
R1 and R2=5 k$\Omega$
$i_s$=1A
$R_s$=0.05 $\Omega$
$V_{be2}$=0.8 volts
$V_{sat(pnp)}$=0.2 volts
Inserting these values into equation (4):

$$V+(\text{min.})=0.05+0.05+0.8+0.2 \approx 1.1\ \text{volt}$$

The present current sense amplifier thus provides better accuracy than was found in previous low voltage designs, while requiring far fewer components than are required in previous designs featuring a comparable accuracy.

Figure 2B:
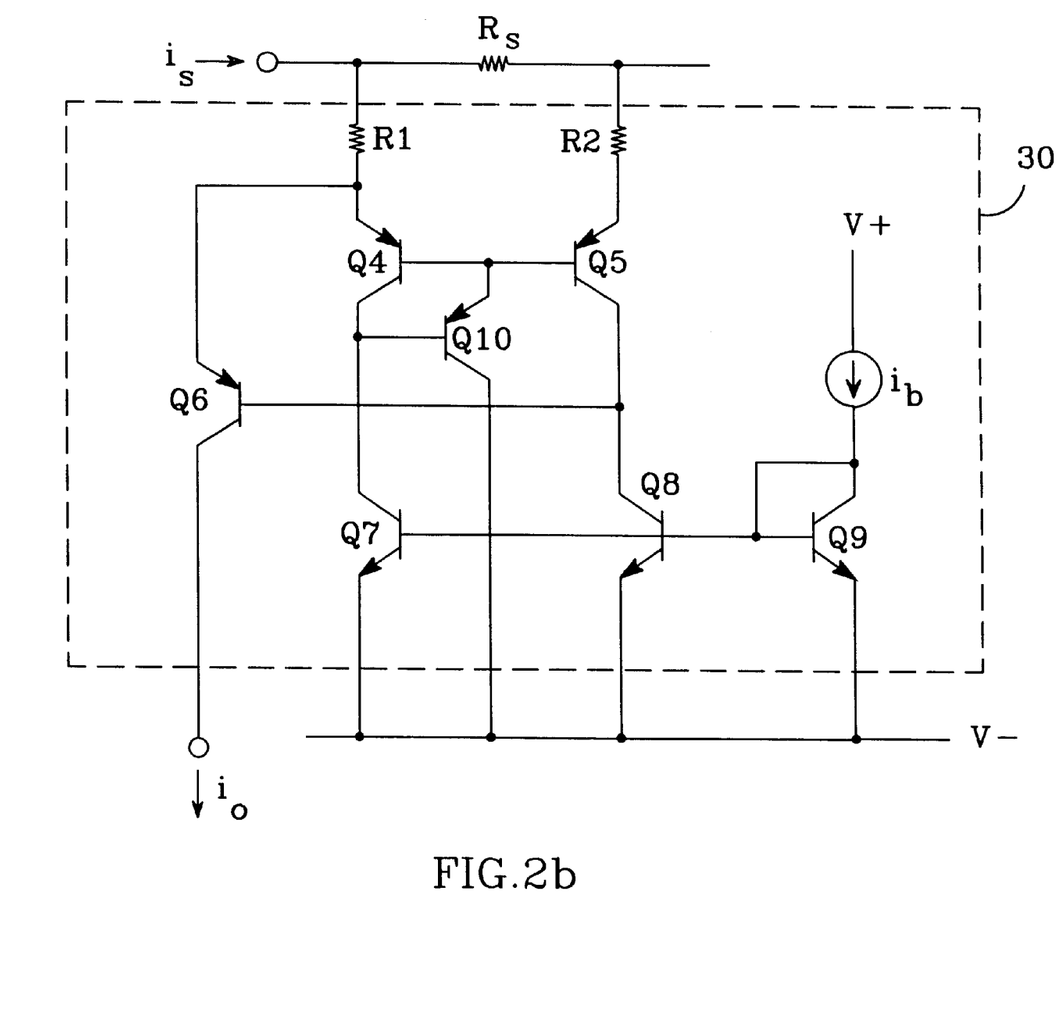
FIG. 2b is a schematic diagram of a bipolar implementation of a high side current sense amplifier per the present invention.

The current sense amplifier of FIG. 2a is configured as a low-side current sense amplifier, useful for sensing currents that are near ground. A high-side current sense amplifier 30 per the present invention is shown in FIG. 2b. FIG. 2b's high-side amplifier preferably uses p-type transistors Q4 and Q5 in place of transistors Q1 and Q2 of FIG. 2a, connected between resistors R1 and R2 and a pair of current sources (described below) equivalent to $i_1$ and $i_2$, respectively. P-type transistor Q6 (analogous to FIG. 2a's Q3) is connected to provide the amplifier's feedback current and produces its output $i_o$. The current sense amplifier of FIG. 2b operates in the same fashion as that of FIG. 2a, but is intended to sense currents near the positive supply voltage, rather than near ground.

An exemplary embodiment of the high-side current sense amplifier's current sources is shown in FIG. 2b, implemented with n-type transistors Q7, Q8, Q9 and a bias current source $i_b$. Bias current source $i_b$ supplies a fixed current to diode-connected npn transistor Q9, establishing its base-emitter voltage. Q9's base is connected in common with that of Q7 and Q8, so that $i_b$ is mirrored to the collectors of Q4 and Q5, respectively. The emitters of Q7–Q9 are connected to a supply voltage V–, which can include ground.

There is a small error inherent in the basic implementation of the invention shown in FIG. 2a, which is rendered nearly negligible in the amplifier of FIG. 2b. The error is due to the fact that, in FIG. 2a, current source $i_1$ supplies the base currents of Q1 and Q2 via Q1's diode connection. Assuming that $i_1=i_2=10$ μA and Q1 and Q2 have a β of 100, Q1's and Q2's base currents—supplied by $i_1$—will be 100 nA each. As a result, Q1's emitter current is reduced to 9.9 μA and Q2's emitter current is increased to 10.1 μA. This difference is reflected in Q2's collector voltage being slightly higher than Q1's, which causes Q3 to supply a 200 nA feedback current to node 26. This small feedback current equalizes the two emitter voltages and balances the circuit. Thus, even when sensed current $i_s=0$, there is a small output current $i_o$.

In FIG. 2*b*, this error is reduced by using a transistor Q10 to provide Q1's and Q2's base currents. Assuming a β for Q10 of 100, Q10 requires a drive of only 2 nA from Q4's current source in order to provide the two 100 nA base currents. Now Q4's and Q5's respective emitter currents are 10.098 μA and 10.1 μA, and Q6 need only provide a feedback current of 2 nA to correct for this difference. Thus, the use of transistor Q10 reduces the amplifier's base current-induced error by a factor of 100. There is, however, a disadvantage to using transistor Q10: the supply voltage needed to operate the amplifier is increased by a full junction drop.

It is preferable that the pair transistors' respective base currents be supplied by one of their respective current sources. This is most conveniently accomplished with a diode-connection as shown in FIG. 2*a*, or with a error-reducing transistor, as in FIG. 2*b*.

Figure 3A:
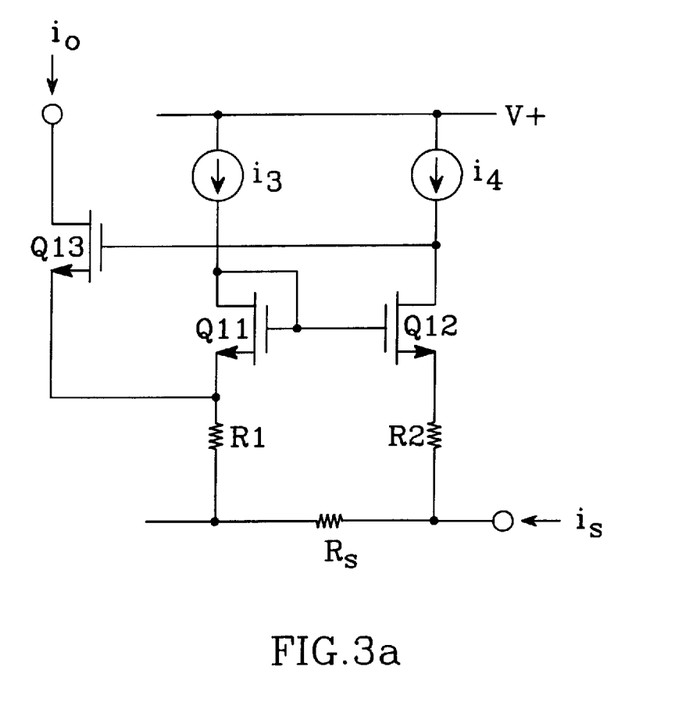
FIGS. 3a and 3b are schematic diagrams of FET implementations of low side and high side current sense amplifiers, respectively, per the present invention.
Figure 3B:
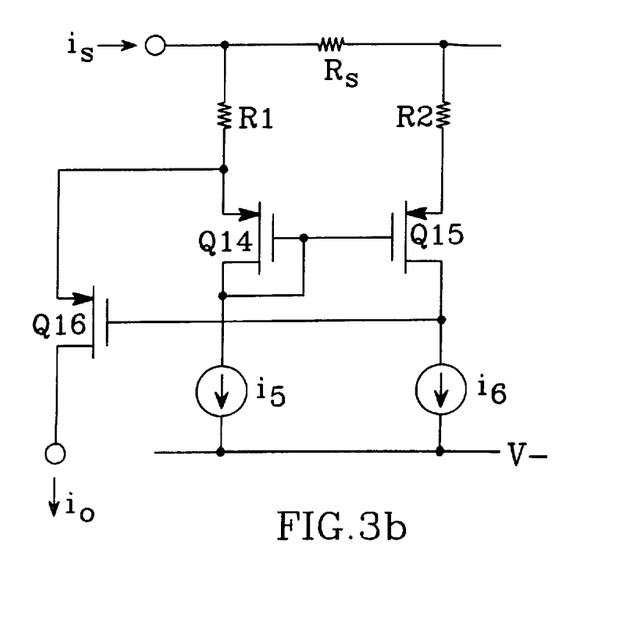

The present current sense amplifier can also be implemented with FET transistors. A low-side current sense amplifier is shown in FIG. 3*a*, and a high-side version is shown in FIG. 3*b*. The amplifier of FIG. 3*a* is identical to that of FIG. 2*a*, except that Q1 and Q2 have been replaced with a pair of n-channel FETs Q11 and Q12 connected in a common-gate configuration, and feedback transistor Q3 is implemented with an n-channel FET Q13. Current sources $i_3$ and $i_4$ can be implemented with FET transistors as well. The high-side current sense amplifier of FIG. 3*b* is similar to its bipolar equivalent shown in FIG. 2*b*, except that transistors Q4 and Q5 are here implemented with p-channel FETs Q14 and Q15, respectively, with feedback transistor Q6 being replaced by a FET Q16.

Equation (3) derived above for the bipolar implementations of FIGS. 2*a* and 2*b* remains valid for the FET implementations of FIGS. 3*a* and 3*b*. The current sources are not restricted to any particular implementation, but a FET implementation analogous to the three transistor current source shown in FIG. 2*b* is preferred. When so configured, the minimum supply voltage needed for a FET implementation is about 1.1 volts, assuming that newer low voltage MOS fabrication processes are employed; older MOS processes would require a somewhat higher supply voltage (~1.5 volts). Because no current flows into the gates of the FET pairs, there is no error analogous to the bipolar version's base current-induced error. As such, the output current $i_o$ produced by the EFET circuits will equal zero for an $i_s=0$, assuming that the circuit's current sources, source resistors, and pair transistors are equal.

Figure 4:
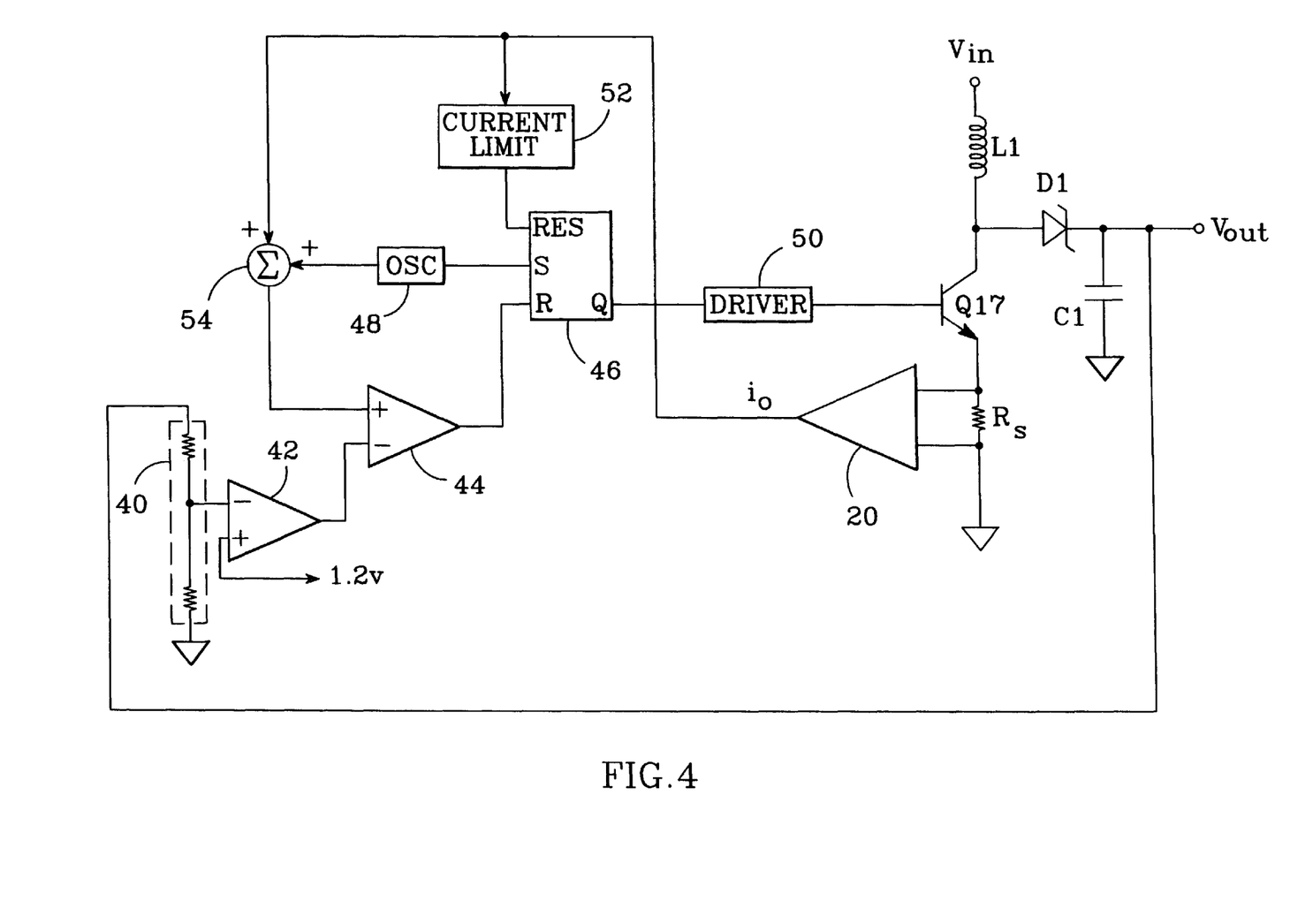
FIGS. 4 and 5 are schematic diagrams of typical current-mode switching regulator applications in which the present current sense amplifier is employed to sense a low side and a high side current, respectively.
Figure 5:
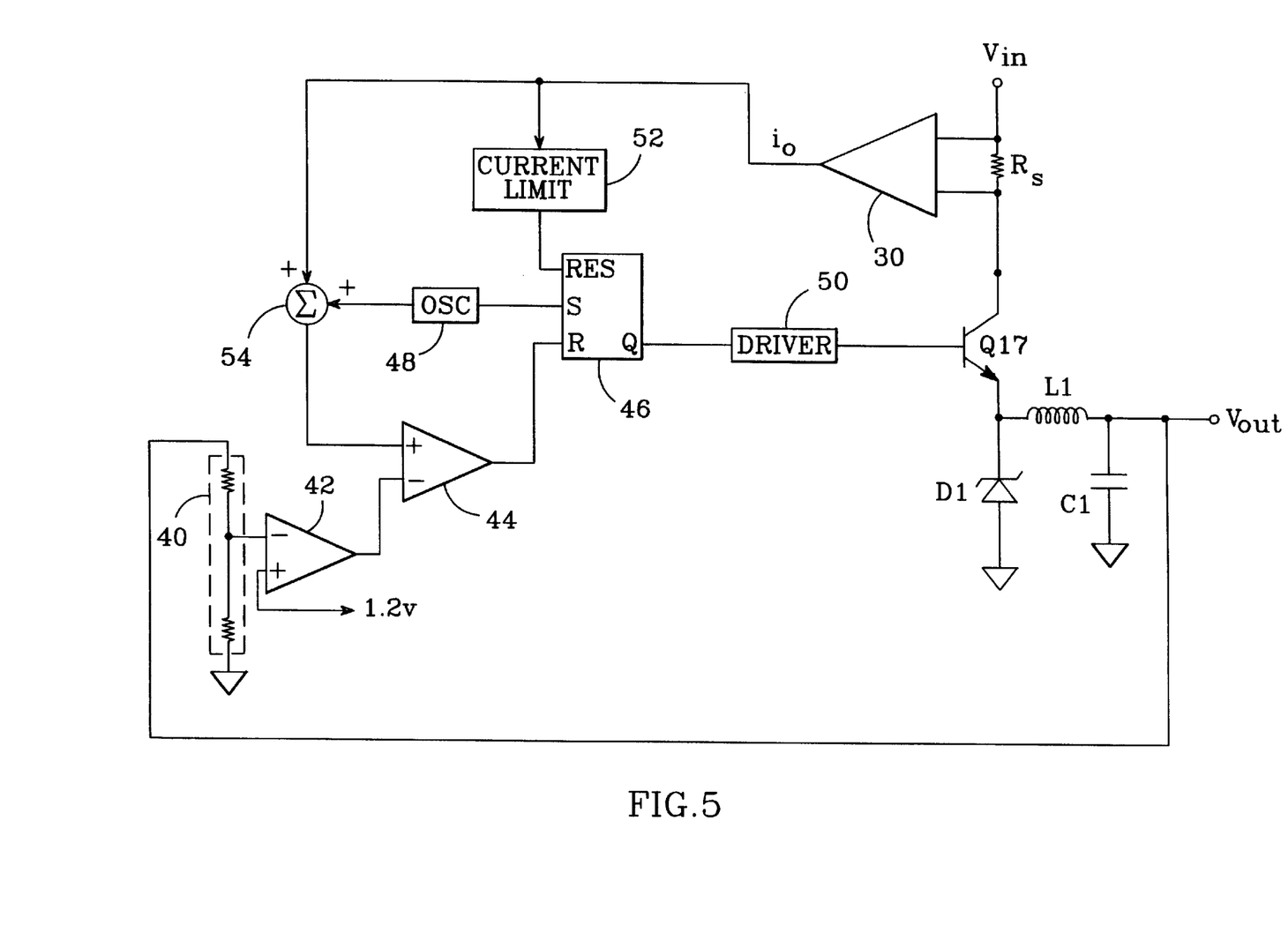

The low voltage current sense amplifiers of the present invention find use in a myriad of applications. For example, the output current $i_o$ developed by the amplifier can be used within an IC for various control functions—to develop a current-mode ramp or limit the current of a power device, for example. Two typical operating environments for the present invention are shown in FIGS. 4 and 5; FIG. 4 depicts a current-mode "boost"-type switching regulator, with a current sense amplifier per the present invention employed on the low side, and FIG. 5 depicts a current-mode "buck"-type switching regulator, with a current sense amplifier per the present invention employed on the high side.

In the boost regulator of FIG. 4, a switching device, typically a transistor Q17, is switched on and off to control the current through an output circuit which includes an inductor L1, a zener diode D1, and a capacitor C1, to produce an output voltage $V_{out}$. The switching is controlled by a feedback network which varies the duty cycle of the switching as necessary to maintain a desired output voltage.

To properly control the switching of Q17, the feedback network receivos signals representative of both the output voltage $V_{out}$ and the current through the switching device as inputs. The output voltage is typically fed to a resistive divider 40 which in turn feeds an error amplifier 42 that also receives a reference voltage. The output of the error amplifier is fed to one input of a pulse width modulated (PWM) comparator 44, the output of which is connected to the "R" input of an RS flip-flop 46. The flip-flop's "S" input is driven by a free-running oscillator 48, and its "Q" output is fed via a driver circuit 50 to the switching device's control input.

A sense resistor $R_s$ is connected between Q17 and circuit ground, and a current sense amplifier 20 per the present invention is connected across $R_s$ to sense the current in Q17. As described above, amplifier 20 produces an output current $i_o$ that is proportional to the sensed current. The output current $i_o$ is used where needed: in this example, it is fed to a current limit circuit 52 that is connected to flip-flop 46 to halt switching if the switched current exceeds a particular limit. The output current $i_o$ is also fed to a summation circuit 54 where it is summed with the oscillator output, with the sum being fed to the other input of the PWM comparator 44. In this way, the switched current as detected by the current sense amplifier 20 is used to control the duty cycle of the signal driving Q17.

The buck-type switching regulator of FIG. 5 is similar, except for the configuration of the output circuit and the positioning of the current sense amplifier. The output circuit's zener diode D1, inductor L1, and capacitor C1 are in Q17's emitter circuit, rather than in its collector circuit as in FIG. 4, and the current sense amplifier is now a high-side current sense amplifier 30, connected across sense resistor $R_s$ inserted between the regulator's input voltage $V_{in}$ and Q17's collector. Amplifier 30 produces an output current $i_o$ that is fed to the current limit and summation circuits as before.

The applications of the current sense amplifier shown in FIGS. 4 and 5 are exemplary only. The invention is useful with many other regulator types and configurations, and could be advantageously employed in nearly any current sensing application. The invention is beneficial whenever it is desired to obtain a small, accurate output current that is representative of a larger current of interest, with very few components and a low supply voltage.

While particular embodiments of the invention have been shown and described, numerous variations and alternate embodiments will occur to those skilled in the art. Accordingly, it is intended that the invention be limited only in terms of the appended claims.

I claim:

1. A current sense amplifier, comprising:
   a pair of transistors having respective control inputs connected in common and respective current circuits, each of said pair of transistors conducting a respective current through its current circuit in response to a voltage applied to its control input,
   a pair of current sources connected to supply bias currents to respective ones of said pair of transistors, one of said current sources connected to supply current to said control inputs, first and second resistors connected in series with said respective current circuits at a first and a second junction, respectively, and at their other ends to a first node and a second node, respectively, a sense resistor $R_s$ connected between said first node and said second node, said pair of transistors, said first and second resistors and said pair of current sources arranged such that the respective currents conducted by said pair of transistors are approximately balanced when no current flows in said sense resistor and become unbalanced when a current $i_s$ flows in said sense resistor, and a third transistor connected to detect unbalanced currents in said pair of transistors and to supply a feedback current $i_o$ to one of said first and second junctions to equalize said transistor currents, said feedback current varying with $i_s$, wherein one of said pair of transistors is diode-connected, said third transistor's control input is connected to the current circuit of the pair transistor that is not diode-connected and said third transistor supplies said feedback current to the current circuit of the pair transistor that is diode-connected.

2. The current sense amplifier of claim 1, wherein said pair of current sources provide approximately equal currents, said first and second resistors have approximately equal resistance values R, and said pair of transistors are well-matched such that they conduct approximately equal currents in response to equal voltages applied to their respective control inputs, such that said feedback current $i_o$ is approximately given by $i_s(R_s/R)$.

3. The current sense amplifier of claim 1, wherein said pair of transistors are bipolar transistors having their bases connected together, their collectors connected to respective ones of said pair of current sources and their emitters connected to respective ones of said pair of resistors, said feedback current maintaining the respective emitter voltages and thereby the respective collector currents of said pair of transistors approximately equal.

4. The current sense amplifier of claim 1, wherein said pair of transistors are field-effect transistors having their gates connected together, their drains connected to respective ones of said pair of current sources and their sources connected to respective ones of said pair of resistors, said feedback current maintaining the respective source voltages and thereby the respective drain currents of said pair of transistors approximately equal.

5. The current sense amplifier of claim 1, wherein said current sources are arranged such that a single transistor is imposed between each of said pair ranststors and a supply voltage, said current sense amplifier thereby capable of operating with a supply voltage of approximately 1.1 volts.

6. The current sense amplifier of claim 1, wherein one of said first and second nodes is grounded such that said current sense amplifier operates as a low side current sense amplifier.

7. The current sense amplifier of claim 1, wherein the voltage at one of said first and second nodes is near a supply voltage such that said current sense amplifier operates as a high side current sense amplifier.

8. A low voltage current sense amplifier, comprising:

first and second transistors having respective control inputs connected in common and respective current circuits, each of said first and second transistors conducting a respective current through its current circuit in response to a voltage applied to its control input, first and second current sources connected to supply bias currents to said first and second transistors, respectively, one of said current sources connected to supply current to said control inputs, first and second resistors connected in series with respective current circuits at a first and a second junction, respectively, and at their other ends to a first node and a second node, respectively, a sense resistor connected in series between said second node and said first node such that the voltage at said second junction increases with respect to said first junction when a sensed current flows in said sense resistor, and a third transistor having a control input connected to said second current source and a current circuit connected to said first junction and providing a feedback current $i_o$ to said first junction to equalize the voltages at said first and second junctions, said feedback current varying with $i_s$, wherein said first transistor is diode-connected such that said current supplied to said control inputs is supplied by said first current source via said diode connection.

9. The low voltage current sense amplifier of claim 8, wherein said first and second current sources provide approximately equal currents, said first and second resistors have approximately equal resistance values R, and said first and second transistors are well-matched such that they conduct approximately equal currents in response to equal voltages applied to their respective control inputs, such that said feedback current $i_o$ is approximately given by $i_s(R_s/R)$.

10. The low voltage current sense amplifier of claim 8, wherein said first and second transistors are bipolar transistors having their bases connected together, their collectors connected to said first and second current sources, respectively, and their emitters connected to said first and second resistors, respectively, said feedback current maintaining the emitter voltages and thereby the collector currents of said first and second transistors approximately equal.

11. The low voltage current sense amplifier of claim 8, wherein said first and second transistors are field-effect transistors having their gates connected together, their drains connected to said first and second current sources, respectively, and their sources connected to said first and second resistors, respectively, said feedback current maintaining the source voltages and thereby the drain currents of said first and second transistors approximately equal.

12. The low voltage current sense amplifier of claim 8, wherein said first and second current sources comprise respective transistors connected between a supply voltage and said first and second transistors, respectively, said current sense amplifier thereby capable of operating with a supply voltage of approximately 1.1 volts.

13. The low voltage current sense amplifier of claim 8, wherein one of said first and second nodes is grounded such that said current sense amplifier operates as a low side current sense amplifier.

14. The low voltage current sense amplifier of claim 8, wherein one of said first and second nodes is near a supply voltage such that said current sense amplifier operates as a high side current sense amplifier.

15. A current-mode switching regulator, comprising:

a switching device which switches on and off in accordance with a driving signal, an output circuit connected to said switching device and producing an output voltage that varies in accordance with the duty cycle of said switching, a feedback network arranged to control said switching device to maintain a desired output voltage, said feedback net-work receiving a signal representing the current through said switching device as an input, and a current sense amplifier which produces said signal representing the current through said switching device, said current sense amplifier comprising:

first and second transistors having respective control inputs connected in common and respective current circuits, each of said first and second transistors conducting a respective current through its current circuit in response to a voltage applied to its control input, said first transistor being diode-connected, first and second current sources connected to supply bias currents to said first and second transistors, respectively, said first transistor being diode-connected such that current is supplied to said control inputs by said first current source via said diode connection, first and second resistors connected in series with the respective current circuits of said first and second transistors at a first and a second junction, respectively, a sense resistor connected between said first and second resistors opposite said first and second junctions and in series with said switching device such that current through said switching device flows through said sense resistor, and a third transistor connected to supply a feedback current to said first junction in response to the voltage at said second junction differing from that at said first junction due to a sensed current flowing through said sense resistor, said feedback current varying with said sensed current to equalize the voltages at said first and second junctions, said feedback current being said signal representing the current through said switching device.

16. A low voltage current sense amplifier, comprising:

first and second transistors having respective control inputs connected in common and respective current circuits, each of said first and second transistors conducting a respective current through its current circuit in response to a voltage applied to its respective control input, first and second current sources connected to supply bias currents to said first and second transistors, respectively, one of said current sources connected to supply current to said control inputs, first and second resistors connected in series with respective current circuits at a first and a second junction, respectively, and at their other ends to a first node and a second node, respectively, a sense resistor connected in series between said second node and said first node such that the voltage at said second junction increases with respect to said first junction when a sensed current flows in said sense resistor, and a third transistor having a control input connected to said second current source and a current circuit connected to said first junction and providing a feedback current $i_o$ to said first junction to equalize the voltages at said first and second junctions, said feedback current varying with $i_s$, and a fourth transistor connected between said one of said current sources connected to supply current to said control inputs and the control inputs of said first and second transistors to provide said first and second transistors' respective control input currents, said fourth transistor connected to reduce the feedback current needed to equalize the voltages at said first and second junctions when $i_s=0$.

* * * * *